United States Patent
Iagodkine et al.

(10) Patent No.: US 10,600,964 B2
(45) Date of Patent: Mar. 24, 2020

(54) HIGHLY CRYSTALLINE ELECTRICALLY CONDUCTING ORGANIC MATERIALS, METHODS OF MANUFACTURE THEREOF AND ARTICLES COMPRISING THE SAME

(71) Applicants: Elissei Iagodkine, Marlborough, MA (US); George L. Athens, Freeland, MI (US); Enrique Daniel Gomez, State College, PA (US); Kiarash Vakhshouri, St. Paul, MN (US)

(72) Inventors: Elissei Iagodkine, Marlborough, MA (US); George L. Athens, Freeland, MI (US); Enrique Daniel Gomez, State College, PA (US); Kiarash Vakhshouri, St. Paul, MN (US)

(73) Assignees: ROHM AND HAAS ELECTRONIC MATERIALS LLC, Marlborough, MA (US); DOW GLOBAL TECHNOLOGIES LLC, Midland, MI (US); THE PENN STATE RESEARCH FOUNDATION, University Park, PA (US)

(*) Notice: Subject to any disclaimer, the term of this patent is extended or adjusted under 35 U.S.C. 154(b) by 329 days.

(21) Appl. No.: 14/109,032

(22) Filed: Dec. 17, 2013

(65) Prior Publication Data

US 2015/0171331 A1    Jun. 18, 2015

(51) Int. Cl.
*H01L 51/00* (2006.01)
*H01L 51/05* (2006.01)

(52) U.S. Cl.
CPC ...... *H01L 51/0036* (2013.01); *H01L 51/0558* (2013.01)

(58) Field of Classification Search
CPC . H01L 51/0036; H01L 51/0558; C08G 75/06; B05D 3/0254; B05D 3/007
(Continued)

(56) References Cited

U.S. PATENT DOCUMENTS 5,546,889 A   8/1996   Wakita et al.
7,314,908 B2  1/2008   Toth et al.
(Continued)

FOREIGN PATENT DOCUMENTS

JP   2009200484 A   9/2009
JP   2009302328 A   12/2009
(Continued)

OTHER PUBLICATIONS

Kirschbaum et al. "Polymer-supported Synthesis of Regioregular Head-to-Tail Coupled Oligo(3-alkylthiophene)s" Synthetic Metals 119 (2001) 127-128.*
(Continued)

*Primary Examiner* — Robert S. Walters, Jr.
(74) *Attorney, Agent, or Firm* — Cantor Colburn LLP

(57) ABSTRACT

Disclosed herein is a composition comprising a regioregular oligothiophene, a regioregular poly[2,5-bis(3-alkylthiophen-2-yl)thieno(3,2-b)thiophene] and/or a benzothiophene; where the regioregular oligothiophene, the regioregular poly [2,5-bis(3-alkylthiophen-2-yl)thieno(3,2-b)thiophene] and the benzothiophene each have a number average molecular weight of less than or equal to 475 grams per mole; where the composition is melted and then annealed at a temperature between a melting point and a glass transition temperature of the composition; the composition having a charge mobility that is greater than a comparative composition that is either not annealed or annealed at the same temperature between the melting point and the glass transition temperature but without being subjected to prior melting.

18 Claims, 2 Drawing Sheets

(58) Field of Classification Search
USPC .......................................................... 427/384
See application file for complete search history.

(56) References Cited

U.S. PATENT DOCUMENTS

| | | | |
|---|---|---|---|
| 7,829,143 | B1 | 11/2010 | Bollman |
| 8,049,209 | B2 | 11/2011 | Wu et al. |
| 9,614,158 | B2 | 4/2017 | Sirringhaus et al. |
| 2007/0131911 | A1 | 6/2007 | Ito |
| 2009/0181509 | A1 | 7/2009 | Pan |
| 2010/0032655 | A1 | 2/2010 | Takimiya et al. |
| 2010/0178727 | A1 | 7/2010 | Hirai et al. |
| 2011/0024731 | A1 | 2/2011 | Takimiya |
| 2011/0156019 | A1 | 6/2011 | Tessler |
| 2012/0100667 | A1 | 4/2012 | Koutake |
| 2012/0273732 | A1 | 11/2012 | Jenekhe et al. |
| 2013/0048992 | A1 | 2/2013 | Ishii et al. |
| 2013/0149812 | A1 | 6/2013 | Newsome |
| 2014/0021413 | A1* | 1/2014 | Gomez .................. H01B 1/127 252/500 |

FOREIGN PATENT DOCUMENTS

| | | |
|---|---|---|
| JP | 2010205749 A | 9/2010 |
| JP | 2013040124 A | 2/2013 |
| JP | 2013175571 A | 9/2013 |
| WO | WO2007100600 A1 | 9/2007 |

OTHER PUBLICATIONS

Vakhshouri et al. "Effect of Crystallization Kinetics on Microstructure and Charge Transport of Polythiophenes" Macromol. Rapid Commun. 2012, 33, 2133-2137, available online Oct. 12, 2012.*

Ebata et al. "Highly Soluble [1]Benzothieno[3,2-b]benzothiophene (BTBT) Derivatives for High-Performance, Solution-Processed Organic Field-Effect Transistors" J.Am.Chem.Soc. 2007, 129, 15732-15733.*

Koch et al. "Thermal and Structural Characteristics of Oligo(3-hexylthiophene)s (3HT)n, n=4-36" Journal of the American Chemical Society Aug. 2013, 135 13699-13709.*

Supporting Information pp. S1-S13 for Ebata et al. "Highly Soluble [1]Benzothieno[3,2-b]benzothiophene (BTBT) Derivatives for High-Performance, Solution-Processed Organic Field-Effect Transistors" Journal of the American Chemical Society 2007, 129 (51) 15732-15733.*

Delongchamp, D.M. et al. "Molecular Basis of Mesophase Ordering in a Thiophene-Based Copolymer" Macromolecules 2008, 41, 5709-5715.

Zhao, K. et al. "A New Method to Improve Poly(3-hexyl thiophene) (P3HT) Crystalline Behavior: Decreasing Chains Entanglement to Promote Order-Disorder Transformation in Solution" Langmuir 2010, 26(1), 471-477.

Chabinyc, Michael L.; "X-Ray Scattering Study of Thin Films of Poly(2,5-bis(3-alkylthiophen-2-yl)thieno[3,2-b] thiophene)", J. Am. Chem. Soc. 2007, 129, 3226-3237.

Goh, Chiatzun, et al; "Molecular-weight-dependent mobilities in regioregular poly(3-hexyl-thiophene) diodes"; American Institute of Physics; Applied Physics Letters 86; Dec. 21, 2005; 122110-122110-3.

Kim, Heejoo, et al.; "Effect of Thermal Annealing on the Performance of P3HT/PCBM Polymer Photovoltaic Cells", Journal of Korean Physical Society, vol. 48, No. 3, Mar. 2006, pp. 441-445.

Kline, R. Joseph, et al.; "Controlling the Field-Effect Mobility of Regioregular Polythiophen by Changing the Molecular Weight", Advanced Materials, vol. 15, No. 18, Sep. 16, 2003, pp. 1519-1522.

Kline, R. Joseph, et al.; "Dependence of Regioregular Poly(3-hexylthiophene) Film Morphology and Field-Effect Mobility on Molecular Weight", Macromolecules, Mar. 12, 2005, p. 3312-3319.

McCullough, Richard D., et al.; "Regioregular Polythiophene Nanowires and Sensors", Organic Field-Effect Transistors IV, edited by Zhenan Bao, David J. Gundlach, Proc. of PSIE vol. 5940 (SPIE, Bellingham, WA 2005), pp. 594005-594005-2.

Song, Mi Yeon, et al.; "Effects of Carrier Mobility on Photocurrent Generation in TiO2/Poly (alkylthiophene) Photovoltaic Devices", Sep. 19, 2006; Macromolecular Research, vol. 14, No. 6, pp. 630-633.

Vakhshouri, Kiarash, et al., "Effect of Crystallization Kinetics on Microstructure and Charge Transport of Polythiophenes"; Macromol. Rapid Commun. 2012, 33, 2133-2137.

"3,4'-Dinexyl-2,2'-bithiophene-5-carboxylic acid", <URL: http://www.chemspider.com/Chemical-Structure.29335436.html>, Retrieved online Feb. 28, 2017, 3 pgs.

* cited by examiner

HIGHLY CRYSTALLINE ELECTRICALLY CONDUCTING ORGANIC MATERIALS, METHODS OF MANUFACTURE THEREOF AND ARTICLES COMPRISING THE SAME

BACKGROUND

This disclosure is related to highly crystalline electrically conducting organic materials, methods of manufacture thereof and to articles comprising the same. In particular, this disclosure relates to highly crystalline electrically conducting oligothiophenes and oligothiophene mixtures, methods of manufacture thereof and articles comprising the same.

Electrically conducting organic materials and semiconducting organic materials are often used in electronic devices that contain displays (e.g., computers, television sets, and the like), as well as in solar cells, and the like. They are employed in these devices in the form of thin film transistors that have flexible and non-flexible substrates. The combination of easy fabrication using methods such as ink-jet printing and roll-to-roll printing, the mechanical flexibility and modest charge mobilities of solution-processable conducting and semiconducting organic materials has the potential to transform the electronics industry. One challenge to the application of organic materials in digital electronics is the inherent complexity of the electrical properties of organic films due to the inherent high degree of disorder in molecular solids.

Electron mobility within semiconducting conjugated polymers is dependent upon intrachain and interchain charge carrier hopping events. For example, charge carriers can hop between different chains due to the presence of intermolecular overlapping electron densities, such as π-π stacking. Consequently, the charge carrier mobility can depend on various aspects of the thin-film structure, such as the crystallinity, orientation of the crystals, electron cloud overlap in the unit cell, and the connectivity between ordered regions of the polymer.

SUMMARY

Disclosed herein is a composition comprising a regioregular oligothiophene, a regioregular poly[2,5-bis(3-alkylthiophen-2-yl)thieno(3,2-b)thiophene] and/or a benzothiophene; where the regioregular oligothiophene, the regioregular poly[2,5-bis(3-alkylthiophen-2-yl)thieno(3,2-b)thiophene] and the benzothiophene each have a number average molecular weight of less than or equal to 475 grams per mole; where the composition is melted and then annealed at a temperature between a melting point and a glass transition temperature of the composition; the composition having a charge mobility that is greater than a comparative composition that is either not annealed or annealed at the same temperature between the melting point and the glass transition temperature but without being subjected to prior melting.

Disclosed herein too is a method of manufacturing a thin film comprising dissolving a regioregular oligothiophene, a regioregular poly[2,5-bis(3-alkylthiophen-2-yl)thieno(3,2-b)thiophene] and/or a benzothiophene in a solvent to form a solution; disposing the solution on a substrate; melting the regioregular oligothiophene, the regioregular poly[2,5-bis(3-alkylthiophen-2-yl)thieno(3,2-b)thiophene] and/or the benzothiophene; and quenching the melted regioregular oligothiophene, the regioregular poly[2,5-bis(3-alkylthiophen-2-yl)thieno(3,2-b)thiophene] and/or the benzothiophene to a temperature between a glass transition temperature and a melting temperature of the regioregular oligothiophene, the regioregular poly[2,5-bis(3-alkylthiophen-2-yl)thieno(3,2-b)thiophene] and/or the benzothiophene.

DETAILED DESCRIPTION

Figure 1:
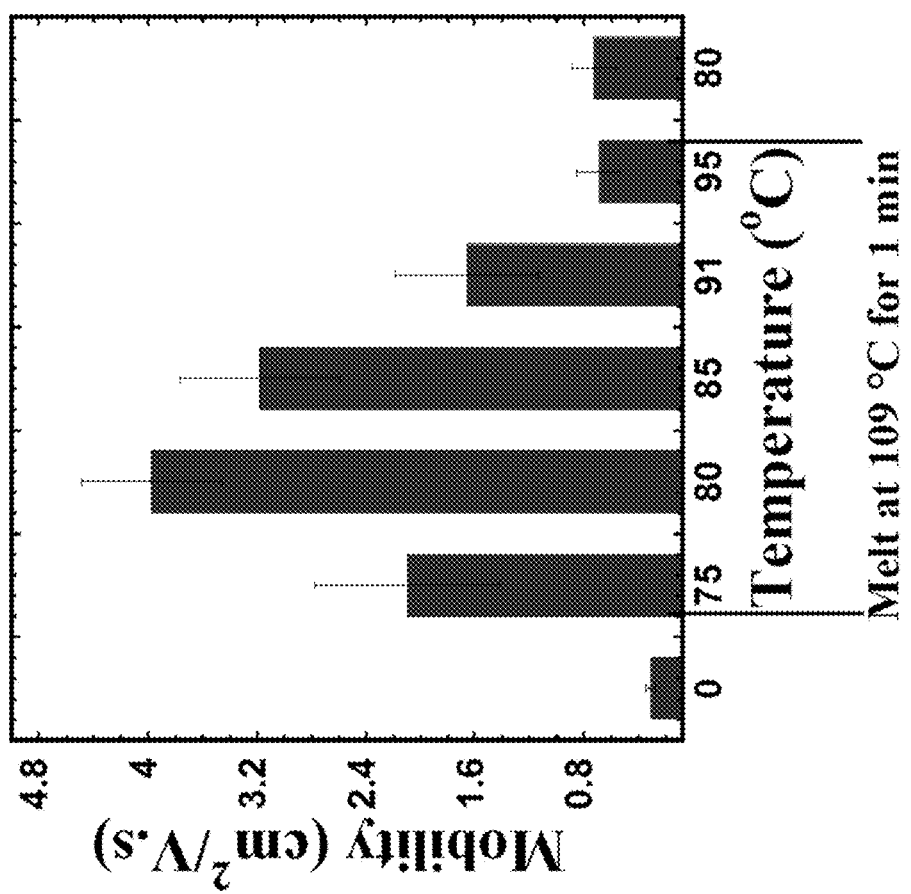
FIG. 1 is a bar chart plot of charge mobility versus crystallization temperature.

The term "and/or" is used herein to mean both "and" as well as "or". For example, "A and/or B" is construed to mean A, B or A and B.

The transition term "comprising" is inclusive of the transition terms "consisting essentially of" and "consisting of" and can be interchanged for "comprising".

Disclosed herein are electrically conducting or semiconducting oligomeric compositions that comprise regioregular oligothiophenes. In one embodiment, the oligothiophenes comprise regioregular poly(alkylthiophenes) (PAT), regioregular poly[2,5-bis(3-alkylthiophen-2-yl)thieno(3,2-b)thiophene] (PBTTT), benzothiophenes, or combinations comprising at least one of the foregoing oligothiophenes. While the terms oligothiophenes and polythiophenes (and variations such as poly(alkylthiophenes), and the like) are used interchangeably, the oligothiophenes and polythiophenes disclosed herein generally have number average molecular weights of less than 475 grams per mole. In an embodiment, the highest molecular weight of an oligomer present in the electrically conducting composition is less than or equal to 475 grams per mole.

In an exemplary embodiment, the regioregular poly(alkylthiophenes) comprises regioregular poly(3-hexylthiophenes) (P3HT) while the regioregular poly[2,5-bis(3-alkylthiophen-2-yl)thieno(3,2-b)thiophene] comprises poly[2,5-bis(3-hexadecylthiophen-2-yl)thieno(3,2-b)thiophene]. In another embodiment, the benzothiophene is 2,7-dioctyl[1]benzothieno[3,2-b][1]benzothiophene (also known as C8-BTBT).

Disclosed herein too, is a method for increasing the crystalline content of electrically conducting or semiconducting oligomeric compositions that comprise benzothiophenes and/or regioregular oligothiophenes. In an exemplary embodiment, the method comprises melting the oligomeric compositions and subsequently quenching the melted oligomeric compositions to different temperatures below the melting temperature. In one embodiment, the oligomeric compositions are quenched to a temperature that is between the glass transition temperature and the melting temperature of the composition. They are annealed to this temperature for time periods of 5 to 1000 seconds. In an exemplary embodiment, the oligomeric films are quenched to temperatures that are 100 to 175° C. below the melting temperature, following which they are annealed at these temperatures for time periods of 5 to 1000 seconds.

The percent crystallinity obtained by this method is at least 50% higher than that reported for other methods of crystallization. These highly crystalline samples display high levels of electron mobility, which makes them useful in thin film transistors. Because the electrically conducting and semiconducting oligomers are flexible they can be disposed on flexible or non-flexible substrates, thereby making them useful in a variety of different applications.

Regioregular oligomers are those in which each repeat unit is derived from the same isomer of the monomer. In an exemplary embodiment, the regioregular oligothiophenes are derived from the oligomerization of 3-substituted thiophenes or alternatively by substituting the oligothiophene in the 3-position. The asymmetry of 3-substituted thiophenes results in three possible couplings when two monomers are linked between the 2- and the 5-positions. They are 2,5' or head-tail (HT) coupling, 2,2' or head-head (HH) coupling or 5,5' or tail-tail (TT) coupling. The three couplings result in 4 distinct triads as shown in the formulas (I) through (IV) below. Structure (I) below has HT-HT couplings

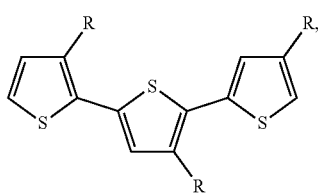

(I)

structure (II) below has HH-TH couplings

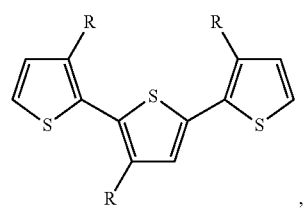

(II)

structure (III) below has HH-TT couplings

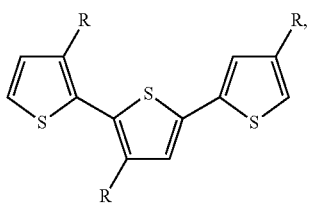

(III)

and structure (IV) has TT-HT couplings

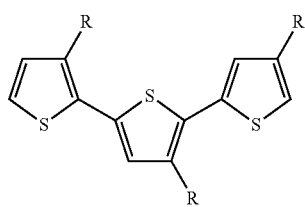

(IV)

where R is an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —$(R^3O)_p$—, where $R^3$ is a $(C_2-C_6)$alkyl group and p is 1 to 10, preferably 1 to 5. Exemplary polyalkylene oxide groups include polyethylene oxide groups, polypropylene oxide groups, polybutylene oxide groups, or mixtures thereof.

In one embodiment, a regioregular oligothiophene can have all HH structures, all TT structures, all HT or all TH structures. When the HH or TT structures are combined with HT or TH structures as shown in the oligothiophene, it is desirable to have at least a first block comprising one of the HH, TT, HT or TH structures copolymerized with a second block of comprising one of the HH, TT, HT or TH structures, where at least one of the blocks has at least 5 or more repeat units and where the structures included in the first block not identical with the structures included in the second block.

In one embodiment, the regioregular oligothiophenes are polyalkylthiophenes that have the structure of formula (V):

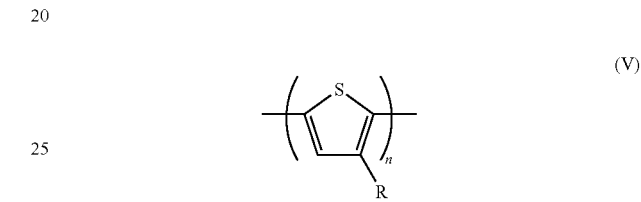

(V)

where R is an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —$(R^3O)_p$—, where $R^3$ is a $(C_2-C_6)$alkyl group and p is 1 to 10, preferably 1 to 50. Exemplary polyalkylene oxide groups include polyethylene oxide groups, polypropylene oxide groups, polybutylene oxide groups, or mixtures thereof. In one exemplary embodiment, R is an alkyl group having 2 to 15 carbon atoms, preferably 3 to 10 carbon atoms. In another exemplary embodiment, R is a hexyl group and the regioregular polyalkylthiophene is poly(3-hexylthiophene). In the formula (V), n has a numerical value such that the oligomer has a number average molecular weight of less than 475 grams per mole. In an embodiment, n is 1 to 6, specifically 2 to 5.

In one embodiment, the regioregular oligothiophenes may be block copolymers of oligoalkylthiophenes that have the structures of formula (VI):

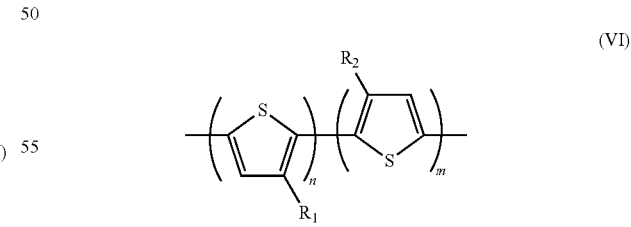

(VI)

where $R_1$ and $R_2$ can be the same or different and are independently a hydrogen, an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —$(R^3O)_p$—, where $R^3$ is a $(C_2-C_6)$alkyl group and p is 1 to 10, preferably 1 to 5. Exemplary polyalkylene oxide groups include polyethylene oxide groups, polypropylene oxide groups, polybutylene oxide groups, or mixtures thereof. In the formula (VI), n is 2 to 5 and m is 2 to 5. The ratio of n to m can vary from 5:2 to 2:5. The block copolymer of formula (VI) can be a diblock, triblock or an alternating block copolymer. In one exemplary embodiment, $R_1$ and $R_2$ are hexyl groups. In another exemplary embodiment, $R_1$ is a hexyl group while $R_2$ is hydrogen. It is desirable for the block copolymers of the oligoalkylthiophenes shown in the formula (VI) to have a molecular weight of less than 475 grams per mole.

In yet another embodiment, the regioregular oligothiophenes may be alternating copolymers of oligoalkylthiophenes that have the structures of formula (VII):

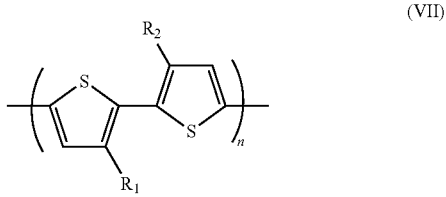

(VII)

where $R_1$ and $R_2$ can be the same or different and are independently a hydrogen, an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —$(R^3O)_p$—, where $R^3$ is a $(C_2-C_6)$alkyl group and p is 1 to 10, preferably 1 to 5. Exemplary polyalkylene oxide groups include polyethylene oxide groups, polypropylene oxide groups, polybutylene oxide groups, or mixtures thereof. In the formula (VII), n is 2 to 5. In one exemplary embodiment, $R_1$ and $R_2$ are hexyl groups. In another exemplary embodiment, $R_1$ is a hexyl group while $R_2$ is hydrogen. It is desirable for the block copolymers of the oligoalkylthiophenes shown in the formula (VII) to have a molecular weight of less than 475 grams per mole.

In another embodiment, the electrically conducting or semiconducting polymeric compositions comprise regioregular poly[2,5-bis(3-alkylthiophen-2-yl)thieno(3,2-b)thiophene] having the structure of formula (VIII)

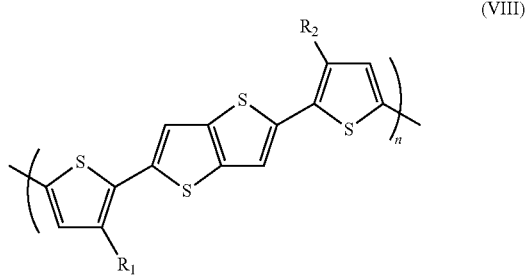

(VIII)

where $R_1$ and $R_2$ can be the same or different and are independently a hydrogen, an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms.

Suitable polyalkylene oxide groups are those of the formula —$(R^3O)_p$—, where $R^3$ is a $(C_2-C_6)$alkyl group and p is 1 to 10, preferably 1 to 5. Exemplary polyalkylene oxide groups include polyethylene oxide groups, polypropylene oxide groups, polybutylene oxide groups, or mixtures thereof. In the formula (VIII), n is 2 to 4. In one exemplary embodiment, $R_1$ and $R_2$ are hexyldecyl groups. In another exemplary embodiment, $R_1$ is a hexadecyl group or a hexyldecyl group while $R_2$ is hydrogen.

It is desirable for the regioregular oligothiophene or the regioregular oligo[2,5-bis(3-alkylthiophen-2-yl)thieno(3,2-b)thiophene] to have a number average molecular weight of less than 475 grams per mole.

In yet another embodiment, the electrically conducting composition comprises a benzothiophene. An exemplary benzothiophene is an alkylbenzothiophenes having the structure of formula (IX)

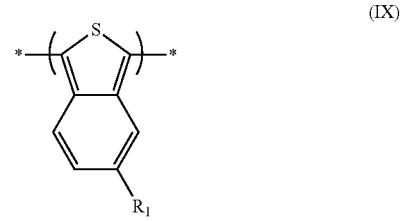

(IX)

where $R_1$ is a hydrogen, an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —$(R^3O)_p$—, where $R^3$ is a $(C_2-C_6)$alkyl group and p is 1 to 10, preferably 1 to 5. Exemplary polyalkylene oxide groups include polyethylene oxide groups, polypropylene oxide groups, polybutylene oxide groups, or mixtures thereof. In the formula (IX), the degree of polymerization is 2 to 5, specifically 3 to 4. In one exemplary embodiment, $R_1$ is a hexyldecyl group. The number average molecular weight of the oligomer having the structure of formula (IX) is 475 grams per mole. In an embodiment, the highest molecular weight of an oligomer of the electrically conductive composition detailed herein is 475 grams per mole.

In an exemplary embodiment, the benzothiophene is dialkylbenzothienobenzothiophene. In an exemplary embodiment, the benzothiophene has the structure shown formula (X)

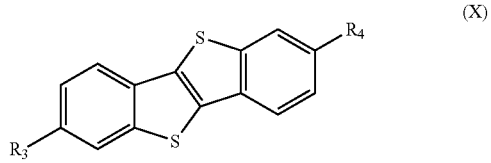

(X)

where $R_3$ and $R_4$ can be the same or different and are independently a hydrogen, an alkyl group having 2 to 10 carbon atoms, an alkylenealkoxy group having 2 to 10 carbon atoms, a polyalkylene oxide group, an alkoxy group having 1 to 10 carbon atoms, an aralkyl group having 7 to 10 carbon atoms, an alkoxy group having 1 to 13 carbon atoms, an alkenyl group having 2 to 13 carbon atoms, an alkenyloxy having 2 to 13 carbon atoms, a cycloalkyl group having 3 to 6 carbon atoms, a cycloalkoxy having 3 to 6 carbon atoms, an aryl group having 6 to 14 carbon atoms, an aryloxy group having 6 to 14 carbon atoms, an arylalkyl group having 7 to 13 carbon atoms, an aralkoxy group having 7 to 13 carbon atoms, an alkylaryl group having 7 to 13 carbon atoms, or an alkylaryloxy group having 7 to 13 carbon atoms. The foregoing groups can be fully or partially halogenated with fluorine, chlorine, bromine, or iodine, or a combination thereof.

In an exemplary embodiment, the dialkylbenzothienobenzothiophene is 2,7-dioctyl[1]benzothieno[3,2-b][1]benzothiophene (also known as C8-BTBT), where $R_3$ is $C_8H_{17}$.

In one embodiment, in one method of manufacturing the highly crystalline electrically conducting or semiconducting polymeric compositions, the regioregular oligothiophene, the regioregular poly[2,5-bis(3-alkylthiophen-2-yl)thieno(3,2-b)thiophene] or the benzothiophene is first dissolved in a solvent at an appropriate temperatures. It is desirable for the solvents to not contain any water, i.e., for the solvent to be anhydrous.

Suitable solvents for solubilizing the regioregular oligothiophene, the regioregular poly[2,5-bis(3-alkylthiophen-2-yl)thieno(3,2-b)thiophene] or the benzothiophene are aromatic or aliphatic hydrocarbons; aliphatic carboxylic esters; chlorohydrocarbons, aliphatic or araliphatic ethers, or a combination comprising at least one of the foregoing solvents. Examples of effective solvents are chlorobenzene, dicholorbenzene, trichlorobenzene, chloroform, toluene, xylene, tetrahydrofuran, dichloromethane, or the like, or a combination comprising at least one of the foregoing solvents.

The weight percent of the regioregular oligothiophene, the regioregular poly[2,5-bis(3-alkylthiophen-2-yl)thieno(3,2-b)thiophene] or the benzothiophene in the solvent is 0.1 to 10 wt %, based on the total weight of the regioregular oligothiophene and/or the regioregular poly[2,5-bis(3-alkylthiophen-2-yl)thieno(3,2-b)thiophene] and the solvent.

The mixture of the regioregular oligothiophene, the regioregular poly[2,5-bis(3-alkylthiophen-2-yl)thieno(3,2-b)thiophene] or the benzothiophene and the solvent is stirred at room temperature for a period of 2 to 30 hours, preferably 4 to 30 hours, and more preferably 8 to 14 hours, followed by stirring at an elevated temperature of 60 to 100° C. for 5 to 120 minutes prior to casting.

The elevated temperature is generally below the vaporization temperature of the solvent and below the degradation temperature of the regioregular oligothiophene, the regioregular poly[2,5-bis(3-alkylthiophen-2-yl)thieno(3,2-b)thiophene] or the benzothiophene.

The regioregular oligothiophene, the regioregular poly[2,5-bis(3-alkylthiophen-2-yl)thieno(3,2-b)thiophene] or the benzothiophene now dissolved in the solvent is then disposed on a substrate and the solvent is allowed to evaporate. The polymer may be disposed on the substrate by dip coating, spray coating, spin casting, curtain coating, doctor-blading, or a combination comprising at least one of the foregoing methods. In one embodiment, the regioregular oligothiophene, the regioregular poly[2,5-bis(3-alkylthiophen-2-yl)thieno(3,2-b)thiophene] or the benzothiophene is disposed on a substrate by spin casting. The spin casting was conducted at a speed of 500 to 5,000 revolutions per minute, preferably 750 to 1,250 revolutions per minute for a time period of 30 seconds to 5 minutes, preferably 45 seconds to 90 seconds.

The substrate is a silicon substrate, a quartz substrate, a polymeric substrate, or the like. The substrate with the spun cast film was then heated to a temperature of greater than the melting point of the regioregular oligothiophene, the regioregular poly[2,5-bis(3-alkylthiophen-2-yl)thieno(3,2-b)thiophene] or the benzothiophene for a period of time of 30 seconds to 5 minutes, preferably 45 seconds to 2 minutes to melt the regioregular oligothiophene, the regioregular poly[2,5-bis(3-alkylthiophen-2-yl)thieno(3,2-b)thiophene] or the benzothiophene.

The melted spun cast regioregular oligothiophene, the regioregular poly[2,5-bis(3-alkylthiophen-2-yl)thieno(3,2-b)thiophene] or the benzothiophene is then quenched to a temperature between the glass transition temperature and the melting temperature of the respective oligothiophene. For poly(3-hexylthiophene) the glass transition temperature is 0° C., while the melting temperature is 230° C. The melted spun cast regioregular oligothiophene, the regioregular poly[2,5-bis(3-alkylthiophen-2-yl)thieno(3,2-b)thiophene] or the benzothiophene is then quenched to a temperature of 50 to 175° C., preferably 75 to 160° C. below the melting point of the regioregular oligothiophene, the regioregular poly[2,5-bis(3-alkylthiophen-2-yl)thieno(3,2-b)thiophene] or the benzothiophene. The heating and quenching of the regioregular oligothiophene, the regioregular poly[2,5-bis(3-alkylthiophen-2-yl)thieno(3,2-b)thiophene] or the benzothiophene is performed in an atmosphere that comprises an inert gas or a combination of inert gases. The quenching is conducted at a rate of 20° C. to 40° C. per second.

Crystalline thin films manufactured from the regioregular oligothiophene, the regioregular poly[2,5-bis(3-alkylthiophen-2-yl)thieno(3,2-b)thiophene] and/or the benzothiophene are used in thin film transistors and field effect transistors. In one embodiment, these thin films can be disposed upon a substrate that contains a source and a drain electrode to form the thin film transistor. Thin film transistors manufactured by using the regioregular oligothiophene, the regioregular poly[2,5-bis(3-alkylthiophen-2-yl)thieno(3,2-b)thiophene] and/or the benzothiophene may be used in display applications, solar cells, photovoltaic cells and the like.

The method of manufacturing the crystalline film is advantageous because it is inexpensive, produces a higher degree of orientation of crystallites than other known methods and may be used in low-power consumption electronic devices. This method of manufacturing the crystalline films produces orientations between crystallites that are at least 10% greater, preferably at least 15% greater and more specifically at least 25% greater than other similar films that are manufactured by methods that do not involve melting followed by quenching and annealing.

The invention is exemplified by the following non-limiting example.

EXAMPLE 1

This example was conducted to demonstrate that oligomeric conductive compositions having number average molecular weights of less than 475 grams per mole can produce higher charge carrier mobilities when annealed after melting when compared with comparative samples that are annealed without being subjected to melting.

Gold source and drain electrodes (with the thickness of ~100 nanometers (nm)) were deposited on silica ($SiO_2$) wafers (with the thickness of 300 nm) using conventional double-layer lithography with channel widths of 220 micrometers (μm) and lengths of 80 μm. After gold electrode deposition, the $SiO_2$ layer was treated with hexamethyldisilazane (>=99% purity commercially available from Sigma- Aldrich) prior to deposition of the organic charge transport layer (4000 rpm for 30 sec). Solutions of 2,7-dioctyl[1]benzothieno[3,2-b][1]benzothiophene (C8-BTBT commercially available from Lumtec) were made with anhydrous toluene in a nitrogen glovebox and then stirred for a minimum of 12 hours prior to spin coating on the electrodes. Films were spun from a 10 mg/mL solution of the 2,7-dioctyl[1]benzothieno[3,2-b][1]benzothiophene in anhydrous toluene at 700 rpm for 1 minute.

Charge carrier mobilities of C8-BTBT thin films were measured as a function of various crystallization temperatures. Samples were first melted at 109° C. for 1 minute and then quenched at various temperatures (crystallization temperatures) for 3 minutes. As shown in FIG. 1, C8-BTBT thin films melted at 109° C. and crystallized at 80° C. exhibited the highest mobilities compared with other crystallization temperatures. The various crystallization temperatures as seen in the FIG. 1 were 75, 80, 85, 91 and 95° C. respectively. The FIG. 1 is a bar chart plot of charge mobility versus crystallization temperature.

Hole mobilities of unannealed C8-BTBT thin films and annealed films at 80° C. for 3 minutes were also measured as controlled samples. These films were not melted and only subjected to annealing. Results from the FIG. 1 show that melting C8-BTBT thin films at 109° C. and then crystallizing them at 80° C. leads to higher charge mobility than samples annealed at 80° C. (without prior melting) as shown in FIG. 1.

X-ray diffraction (XRD) experiments were used to measure the crystal orientation of the C8-BTBT thin films. X-ray measurements were performed at the Material Characterization Laboratory at the Pennsylvania State University with Rigaku DMAX-Rapid Micro diffractometer using a 2-dimensional detector. The X-ray wavelength, λ, was 1.54 Å. Rocking curves were obtained by rocking the sample (+/−0.2°) during data acquisition. Intensities as a function of azimuthal angle (θ) were obtained by integrating over a+/−0.019 Å$^{-1}$ q window (q=4π Sin(θ/2)/λ). A linear background was subtracted from the rocking curve data using intensities away from the Bragg peak of interest.

Figure 2:
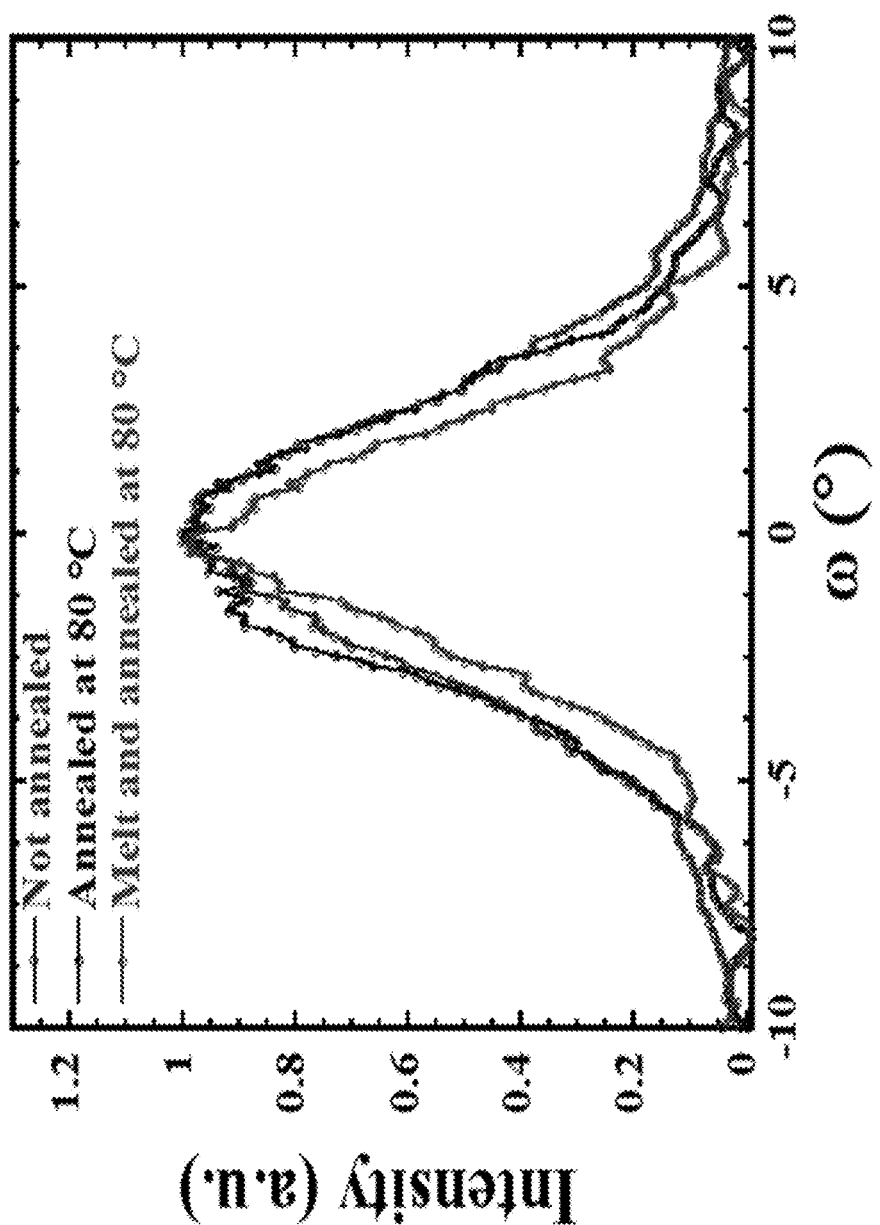
FIG. 2 shows that melting C8-BTBT thin films at 109° C. and then crystallizing at 80° C. leads to more narrow peaks compared to un-annealed samples and samples annealed at 80° C. (without prior melting).

Intensities of the C8-BTBT (300) peak as a function of azimuthal angle can be used to estimate the crystal orientation of C8-BTBT thin films for various thermal annealing procedures. FIG. 2 shows that melting C8-BTBT thin films at 109° C. and then crystallizing at 80° C. leads to more narrow peaks compared to not annealed samples and samples annealed at 80° C. The narrower, sharper peak obtained for the samples that were first melted and then annealed (80° C.) samples indicates that the crystals are more oriented within films and consequently possess more long-range order. Table 1 shows the measured full width half max (FWHM) for the three films shown in FIG. 2.

TABLE 1

| Processing condition | FWHM (degrees, w) |
|---|---|
| Not annealed | 5.5 |
| Annealed at 80 C. | 5.4 |
| Melted and quenched at 80 C. | 4.3 |

From the Table 1 it may be seen that the melting and annealing protocol leads to more oriented crystals, as denoted by the lower full width at half maximum (FWHM). Thus, melting films prior to annealing leads to better long range order and consequently to higher charge mobilities when compared to annealed films that are not subjected to melting. In other words, melting C8-BTBT films and then quenching to 80° C. leads to a lower FWHM, suggesting a more narrow distribution of crystalline orientation.

What is claimed is:

1. A melted and annealed composition comprising:
   a composition comprising a regioregular oligothiophene, a benzothiophene oligomer, and/or a compound of formula (X):

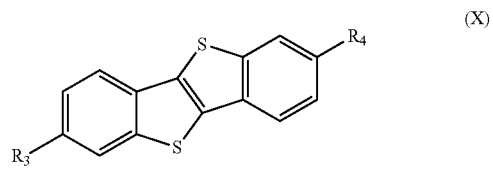

(X)

where $R_3$ and $R_4$ can be the same or different and are independently a hydrogen, an alkyl group having 2 to 10 carbon atoms, an alkoxyalkyl group having 2 to 10 carbon atoms, a polyalkylene oxide group, an alkoxy group having 1 to 13 carbon atoms, an alkenyl group having 2 to 13 carbon atoms, an alkenyloxy group having 2 to 13 carbon atoms, a cycloalkyl group having 3 to 6 carbon atoms, a cycloalkoxy having 3 to 6 carbon atoms, an aryl group having 6 to 14 carbon atoms, an aryloxy group having 6 to 14 carbon atoms, an arylalkyl group having 7 to 13 carbon atoms, an alkylaryl group having 7 to 13 carbon atoms, or an alkylaryloxy group having 7 to 13 carbon atoms;

where the regioregular oligothiophene, the benzothiophene oligomer, and the compound of formula (X) each have a number average molecular weight of less than or equal to 475 grams per mole; and where the composition is melted and then annealed for 5 to 1,000 seconds at a temperature between a melting point and a glass transition temperature of the composition to form the melted and annealed composition; wherein the melted and annealed composition has a charge mobility that is greater than the composition that is either not annealed or annealed at the same temperature between the melting point and the glass transition temperature but without being subjected to prior melting.

2. The melted and annealed composition of claim 1, where the regioregular oligothiophene has the structure of formula (V):

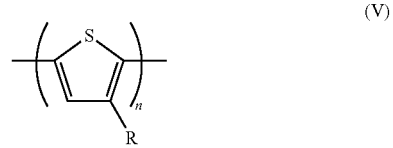

(V)

where R is an alkyl group having 2 to 10 carbon atoms, an alkoxyalkyl group having 2 to 10 carbon atoms, a polyalkylene oxide group of the formula —(R$^3$O)$_p$—, where R$^3$ is a (C$_2$-C$_6$)alkyl group and p is 2 to 10, an alkoxy group having 1 to 10 carbon atoms, or an aralkyl group having 7 to 10 carbon atoms, and where n is 2 to 5.

3. The melted and annealed composition of claim 2, where the regioregular oligothiophene is poly(3-hexylthiophene).

4. The melted and annealed composition of claim 1, where the regioregular oligothiophene has the structure of formula (VI):

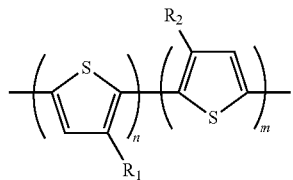

(VI)

or the structure of formula (VII):

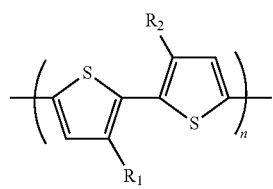

(VII)

where $R_1$ and $R_2$ are independently a hydrogen, an alkyl group having 2 to 10 carbon atoms, an alkoxyalkyl group having 2 to 10 carbon atoms, a polyalkylene oxide group of the formula $—(R^3O)_p—$, where $R^3$ is a $(C_2$-$C_6)$alkyl group and p is 2 to 10, an alkoxy group having 1 to 10 carbon atoms, or an aralkyl group having 7 to 10 carbon atoms, and where n is 2 to 5 and m is 2 to 5 and where the ratio of n to m can vary from 2:5 to 5:2.

5. The melted and annealed composition of claim 4, where $R_1$ and $R_2$ are hexyl groups or where $R_1$ is a hexyl group and $R_2$ is hydrogen.

6. The melted and annealed composition of claim 1, where the benzothiophene oligomer has the structure of formula (IX)

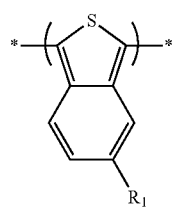

(IX)

where $R_1$ is a hydrogen, an alkyl group having 2 to 10 carbon atoms, an alkoxyalkyl group having 2 to 10 carbon atoms, an alkoxy group having 1 to 10 carbon atoms, an aralkyl group having 7 to 10 carbon atoms, or a polyalkylene oxide group of the formula $—(R^3O)_p—$, where $R^3$ is a $(C_2$-$C_6)$alkyl group and p is 2 to 10, and where n is 2 to 5.

7. The melted and annealed composition of claim 1, where the compound of formula (X) is 2,7-dioctyl[1]benzothieno[3,2-b][1]benzothiophene.

8. The melted and annealed composition of claim 1, where the melted and annealed composition has a higher crystallinity than the composition that is either not annealed or annealed at the same temperature between the melting point and the glass transition temperature but without being subjected to prior melting.

9. A method of manufacturing a thin film comprising:
dissolving a benzothiophene oligomer, a compound of formula (X), and/or a regioregular oligothiophene in a solvent to form a solution; where the benzothiophene oligomer, the compound of formula (X), and/or the regioregular oligothiophene each have a number average molecular weight of less than or equal to 475 grams per mole;
disposing the solution on a substrate;
melting the benzothiophene oligomer, the compound of formula (X), and/or the regioregular oligothiophene; and
quenching the melted benzothiophene oligomer, the compound of formula (X), and/or the regioregular oligothiophene to a temperature between a glass transition temperature and a melting temperature of the benzothiophene oligomer, the compound of formula (X), and/or the regioregular oligothiophene,

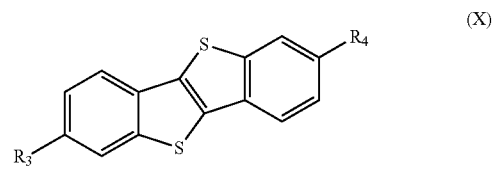

(X)

where $R_3$ and $R_4$ can be the same or different and are independently a hydrogen, an alkyl group having 2 to 10 carbon atoms, an alkoxyalkyl group having 2 to 10 carbon atoms, a polyalkylene oxide group, an alkoxy group having 1 to 13 carbon atoms, an alkenyl group having 2 to 13 carbon atoms, an alkenyloxy group having 2 to 13 carbon atoms, a cycloalkyl group having 3 to 6 carbon atoms, a cycloalkoxy having 3 to 6 carbon atoms, an aryl group having 6 to 14 carbon atoms, an aryloxy group having 6 to 14 carbon atoms, an arylalkyl group having 7 to 13 carbon atoms, an alkylaryl group having 7 to 13 carbon atoms, or an alkylaryloxy group having 7 to 13 carbon atoms.

10. The method of claim 9, where the quenching is conducted at a temperature of 50° C. to 175° C. below the melting temperature.

11. The method of claim 10, further comprising annealing the benzothiophene oligomer, the compound of formula (X), and/or the regioregular oligothiophene at the temperature between the glass transition temperature and the melting temperature for 5 to 1,000 seconds.

12. The method of claim 9, further comprising evaporating the solvent from the solution disposed on the substrate.

13. The method of claim 9, where the regioregular oligothiophene has the structure of formula (V):

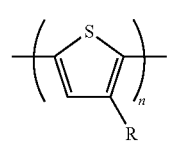

(V)

where R is an alkyl group having 2 to 10 carbon atoms, an alkoxyalkyl group having 2 to 10 carbon atoms, a polyalkylene oxide group of the formula $—(R^3O)_p—$, where $R^3$ is a $(C_2$-$C_6)$alkyl group and p is 2 to 10, an alkoxy group having 1 to 10 carbon atoms, or an aralkyl group having 7 to 10 carbon atoms, and where n is 2 to 5.

14. The method of claim 13, where the regioregular oligothiophene is poly(3-hexylthiophene).

15. The method of claim 9, where the regioregular oligothiophene has the structure of formula (VI):

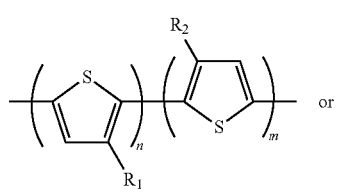

(VI)

or the structure of formula (VII):

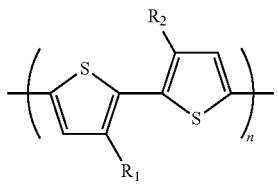

(VII)

where $R_1$ and $R_2$ are independently a hydrogen, an alkyl group having 2 to 10 carbon atoms, an alkoxyalkyl group having 2 to 10 carbon atoms, a polyalkylene oxide group of the formula $-(R^3O)_p-$, where $R^3$ is a $(C_2-C_6)$alkyl group and p is 2 to 10, an alkoxy group having 1 to 10 carbon atoms, or an aralkyl group having 7 to 10 carbon atoms, and where n is 2 to 5 and m is 2 to 5 and where the ratio of n to m can vary from 2:5 to 5:2.

16. The method of claim 15, where $R_1$ and $R_2$ are hexyl groups or where $R_1$ is a hexyl group and $R_2$ is hydrogen.

17. The method of claim 9, where the benzothiophene oligomer has the structure of formula (IX)

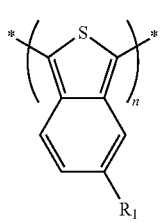

(IX)

where $R_1$ is a hydrogen, an alkyl group having 2 to 10 carbon atoms, an alkoxyalkyl group having 2 to 10 carbon atoms, an alkoxy group having 1 to 10 carbon atoms, an aralkyl group having 7 to 10 carbon atoms, or a polyalkylene oxide group of the formula $-(R^3O)_p-$, where $R^3$ is a $(C_2-C_6)$alkyl group and p is 2 to 10, and where n is 2 to 5.

18. The method of claim 9, where the compound of formula (X) is 2,7-dioctyl[1]benzothieno[3,2-b][1]benzothiophene.

* * * * *